(12) United States Patent
Brink et al.

(10) Patent No.: US 8,713,485 B2
(45) Date of Patent: Apr. 29, 2014

(54) CATEGORIZATION OF DESIGN RULE ERRORS

(75) Inventors: Richard S. Brink, Rochester, MN (US); Michael R. Curry, Rochester, MN (US); Jay A. Lawrence, Rochester, MN (US); Thomas C. Perez, Austin, TX (US); Scott Trcka, Rochester, MN (US); John W. Zack, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/482,624

(22) Filed: May 29, 2012

(65) Prior Publication Data

US 2013/0326445 A1    Dec. 5, 2013

(51) Int. Cl.
*G06F 17/50* (2006.01)

(52) U.S. Cl.
USPC ............... 716/52; 716/51; 716/53; 716/54; 716/55; 716/112

(58) Field of Classification Search
USPC .............................. 716/50–56, 112
See application file for complete search history.

(56) References Cited

U.S. PATENT DOCUMENTS

| | | | |
|---|---|---|---|
| 5,987,240 A | 11/1999 | Kay | |
| 6,063,132 A | 5/2000 | DeCamp et al. | |
| 6,117,179 A | 9/2000 | Tan et al. | |
| 6,397,373 B1 * | 5/2002 | Tseng et al. | 716/52 |
| 7,281,222 B1 | 10/2007 | Babcock | |
| 7,313,774 B2 | 12/2007 | Wright et al. | |
| 7,380,228 B2 | 5/2008 | Fry et al. | |
| 7,434,195 B2 | 10/2008 | Hsu et al. | |
| 7,530,048 B2 | 5/2009 | Joshi | |
| 7,934,174 B2 | 4/2011 | Tang et al. | |
| 2006/0236296 A1 * | 10/2006 | Melvin et al. | 716/20 |
| 2006/0288318 A1 * | 12/2006 | Wright et al. | 716/5 |
| 2008/0263484 A1 * | 10/2008 | Kobayashi | 716/5 |
| 2010/0185999 A1 * | 7/2010 | Graur et al. | 716/20 |
| 2010/0192113 A1 * | 7/2010 | Brelsford et al. | 716/5 |

OTHER PUBLICATIONS

Puryear, "Enhancing the DRC Waiver Methodology for Layout Verification Productivity", White Paper, May 2009, pp. 1-6, © 2009 Synopsys, Inc., Mountain View, CA.

* cited by examiner

*Primary Examiner* — Nha Nguyen (74) *Attorney, Agent, or Firm* — Jonathan V. Sry; Robert R. Williams (57) ABSTRACT

Embodiments of the invention include a method for categorizing and displaying design rule errors. The method may include receiving, from a design rule checker, more than one violation of a design rule within a design layout. The method may also include determining distinct categories of the design rule violations by comparing parameters associated with the design rule violations.

16 Claims, 7 Drawing Sheets

CATEGORIZATION OF DESIGN RULE ERRORS

TECHNICAL FIELD

The present invention relates to the field of integrated circuit design, and more specifically, to checking an integrated circuit design for compliance with design rules.

BACKGROUND

Present day integrated circuits (IC) are typically designed using electronic design automation (EDA) software. These programs perform a variety of tasks such as data entry capture, simulation, partitioning of logic, synthesis, wiring and placement, and testing. One aspect of EDA software performs a process known as design rule checking (DRC), or alternatively, ground rule checking. Design rules are a collection of geometrical restrictions that relate to the geometrical shapes that define the layout of an IC. These rules are typically determined by the manufacturing process used to fabricate the IC and may be established by an IC foundry. An IC that complies with the design rules for a particular process is likely to be manufacturable when that manufacturing process is used. Accordingly, design rule checking is an essential step in any IC design process.

SUMMARY

Embodiments of the invention include a method for categorizing and displaying design rule errors. The method may include receiving, from a design rule checker, more than one violation of a design rule within a design layout. The method may also include determining distinct categories of the design rule violations by comparing parameters associated with the design rule violations.

Other embodiments of the invention include a method. The method may include receiving, from a design rule checker, a plurality of violations of a design rule within an IC layout. Each violation may have an error marker and the IC layout may have two or more cells. The method may also include determining a local region for each of the plurality of violations. For each of the plurality of violations, the method may also include determining one or more parameters associated with the local region, and classifying the violation as being of a particular error type if the associated parameters are substantially similar to corresponding parameters for the error type.

BRIEF DESCRIPTION OF THE SEVERAL VIEWS OF THE DRAWINGS

In the drawings and the Detailed Description, like numbers generally refer to like components, parts, steps, and processes.

DETAILED DESCRIPTION

During the design process of an IC, the physical design of the IC is created, which may be referred to as the layout design, or simply the layout. The layout may be a computer representation of the desired physical structure to be rendered on an IC. The layout design is generally displayed by layout design software as a set of polygons. Each element of the IC, such as a gate of a transistor or a connection between components, may be represented by one or more polygons. The design rules specify restrictions for a layout design that if complied with generally ensure that a wafer will yield a particular percentage of ICs in which the individual elements of the design will operate correctly. For example, these restrictions may be the smallest width of a line or the smallest space between two lines.

Often there are patterns of elements that are placed multiple times in the layout design. A particular pattern of elements may be referred to as a cell. For example, a cell may be a multiple transistor memory cell in an SRAM. A cell may be multiple transistors that implement a logic function. A cell may be designed and then tested for compliance with various design rules. Cells may be any desired size. A particular cell may be placed in a layout many times. A duplicated cell may be referred to as an "instance" of a particular cell. The original cell from which duplicates are made may be referred to as a parent cell. Particular cells may be placed within other cells thereby forming cells made from cells. Accordingly, layouts are generally described hierarchically. In short, a cell is a pattern of elements that may be referenced together and placed at multiple locations in a layout.

A particular cell or an entire layout design may be loaded into a DRC program. Examples of DRC software include Calibre® by Mentor Graphics, Guardian DRC™ by Silvaco Inc., or any other software capable of performing DRC. The DRC generates an output of the violations, errors, or fails, of the set of design rules.

During the process of DRC, every element of the layout design is checked for compliance with a large number of design rules. When an element does not comply with a rule it generates an error associated with the element and the rule. Although a particular cell standing alone may not generate an error, the same cell placed adjacent to another cell may generate an error as a result of its proximity to the other cell. Because of the vast number of elements in a layout design, it may be common to receive a very large number of violations of a single design rule.

Figure 1:
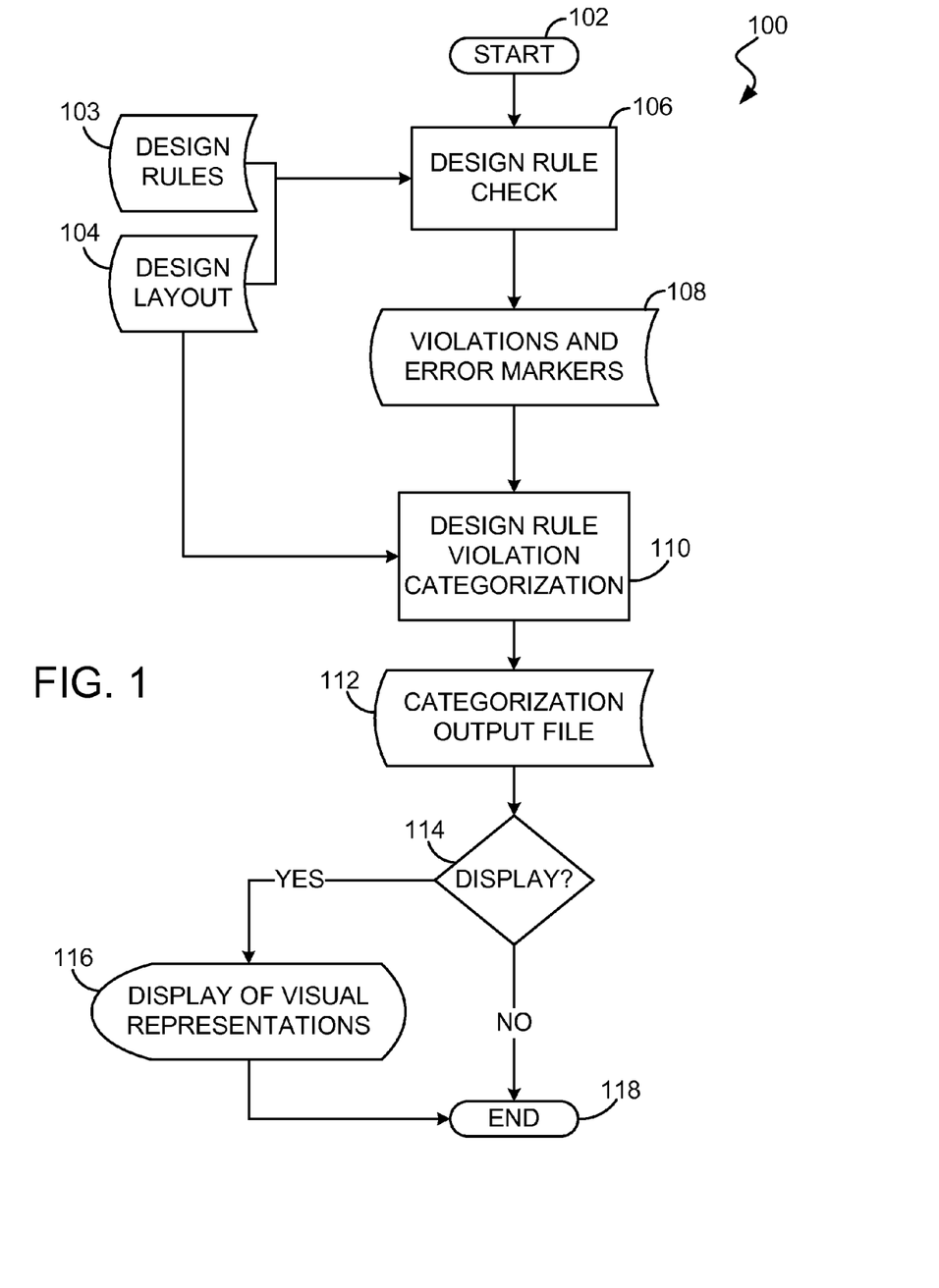
FIG. 1 is a flowchart of processing a design layout through DRC and performing a process to categorize violations of a design rule by type, in accordance with embodiments of the present invention.

FIG. 1 is a flowchart of processing a design layout through DRC and performing a process to categorize violations of a design rule by type, in accordance with embodiments of the present invention. The process 100 moves from start 102 to a design rule check 106. At the design rule check 106, a design layout 104 is analyzed for any violation of a set of design rules 103. Examples of violations may be if a shape representing an element of the IC design is too small or if one shape is too close to another. The design rule check 106 may produce a file 108 containing violations of design rules 103 and error markers associated with each violation. As an example, an error marker may contain a measurement of one edge of a shape and the distance from that edge to another shape that is in violation of a proximity rule.

Figure 6:
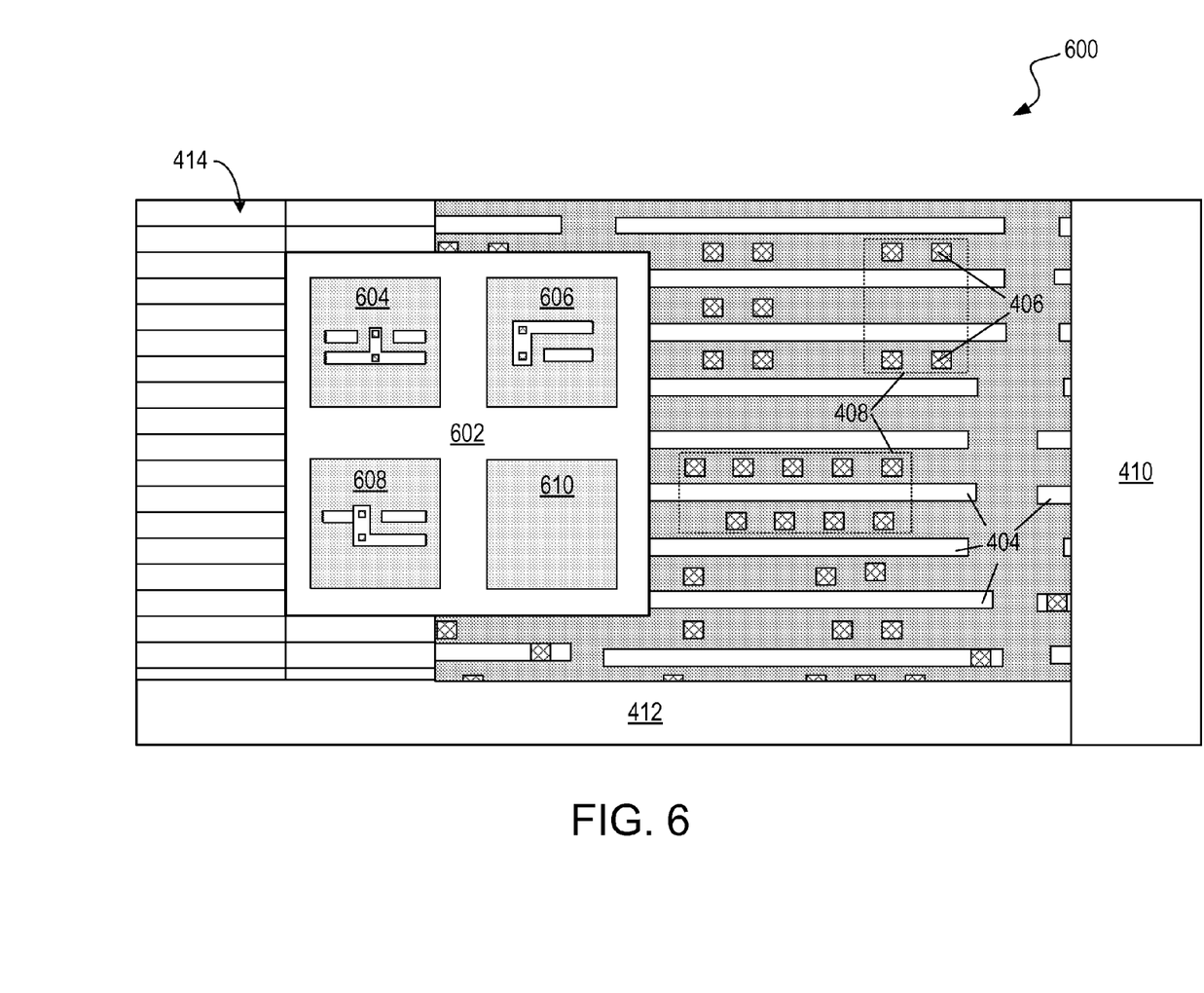
FIG. 6 illustrates an image displayed by a DRC program, the image including a visual representation of one or more categories of error violations, according to an embodiment.

The process 100 may also include determining distinct categories of the design rule violations (operation 110). The operation 110 may compare parameters associated with design rule violations and categorize the violations by a process further detailed in FIG. 2. The design layout 104 and the violations and error markers 108 may be provided to operation 110. The operation 110 may produce a categorization file 112 containing the categorized violations. The process 100 may include an option (operation 114) of displaying a visual representation 116 of the results of the categorization process. An example of a visual representation that may be displayed is shown in FIG. 6. The process 100 may end at block 118.

Figure 2:
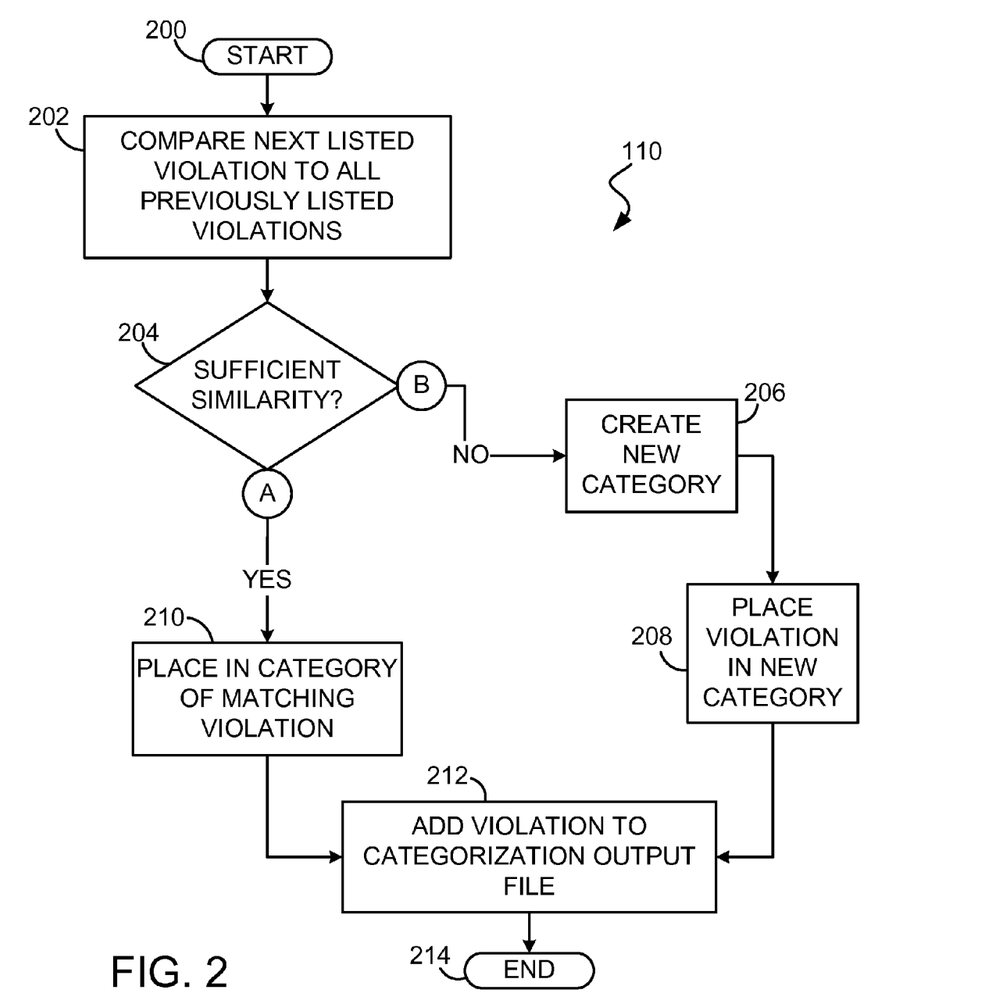
FIG. 2 is a flowchart of the process of categorizing violations of a design rule by type of FIG. 1, the process including a determining similarity operation.

FIG. 2 is a flowchart of a process of categorizing violations of a design rule by type (operation 110) of the process 100 according to one embodiment. The categorization process 110 may begin in operation 200. In operation 202, each violation of a design rule may be compared with all other previously categorized violation types of the design rule. The process may be iterative. In one embodiment, violation types of a particular design rule may not be determined or defined beforehand. Instead, the violation types may be determined or defined by the operation 110. A first listed violation may be categorized as a first type of violation of the design rule, thereby defining a first violation category. In operation, 202, a next listed violation may be compared to all defined violation categories. If the next listed violation is sufficiently similar (deciding operation 204) to one of the defined violation categories, then the next listed violation is placed in that category in operation 210. If the next listed violation is not sufficiently similar (deciding operation 204) to one of the defined violation categories, then a new category may be created or defined in operation 206 and that violation will be place in that new category 208. In this way, violation categories may be dynamically determined or defined. Once a violation is placed in a category, either a previously defined category or a new category, it may be added to a categorization output file 112 in operation 212. This process of categorization 110 may be repeated for each violation of the particular design rule, whereby each violation is compared with all previously defined violation categories.

Figure 3:
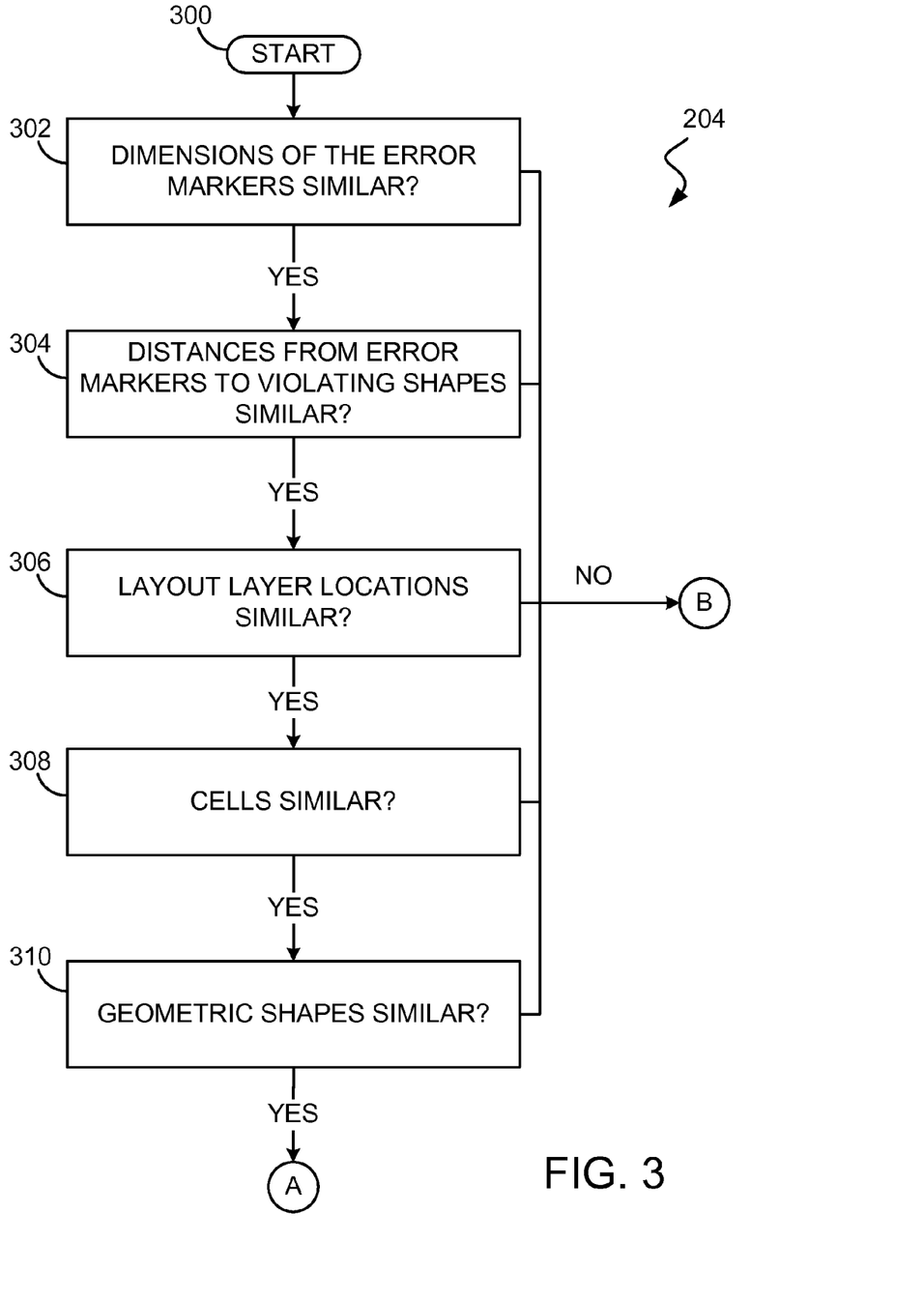
FIG. 3 is a flowchart of the determining similarity operation of FIG. 2.

FIG. 3 is a flowchart of deciding operation 204 for determining whether a violation is sufficiently similar to a defined category of violation. The deciding operation 204 may include comparing the parameters of each violation to determine whether the parameters are sufficiently similar to parameters associated with a defined category. For this process, the amount of similarity required for violations to be sufficiently similar may be predetermined or may be defined by a user in various embodiments. The amount of similarity required may be an exact match of values of the parameters, or it may be an amount within a range of the value of the parameters.

The deciding operation 204 may include a start operation 300. In an operation 302, the dimensions of an error marker for a violation may be compared with error marker dimensions associated with each defined category of violation. As one example, these dimensions may be one edge of a shape that represents a metal wire within a design layout. If the dimensions are not sufficiently similar, a new category may be created in operation 206. If the dimensions are sufficiently similar, then the deciding operation 204 may move to an operation 304.

In operation 304, the distance from an error marker to a violating shape for a violation may be compared with a distance from an error marker to a violating shape associated with each defined category of violation. As one example, these distances may be from one edge of one wire (the location of the error marker) to an edge of an adjacent wire (the location of the violating shape). If the distances are not sufficiently similar, a new category may be created in operation 206. If the distances are sufficiently similar, then the deciding operation 204 may move to an operation 306.

In operation 306, one or more layers in which a violation of a design rule occurs may be compared with one or more layers associated with each defined category of a design rule violation. A violation of a particular design rule may occur in one layer. As one example of an error that may be associated with one layer, a design rule may specify a minimum distance between two adjacent objects in the same layer. On the other hand, a violation of particular design rule may occur in more than one layer. As one example of an error that may be associated with more than one layer, a design rule may specify that a metal contact in one layer must be covered by an insulating layer of a minimum thickness. In operation 306, a violation of a particular design rule may be compared with defined categories of the design rule violation to determine if the layers are sufficiently similar. In one embodiment, the layout layers are sufficiently similar if they are the same layers. If the layout layers are not sufficiently similar, a new category may be created in operation 206. If the layout layers are sufficiently similar, then the deciding operation 204 may move to an operation 308.

In operation 308, the one or more identification parameters of a cell associated with a violation may be compared with one or more identification parameters of cells associated with each defined category of violation. As explained above, a layout may be structured hierarchically with multiple instances of a cell located throughout the design layout, and multiple instances of particular cells located within other cells. An identification parameter for a cell may specify that it is an instance of a particular parent cell. An identification parameter for a cell may specify other cells that are included within it or in which it is included. A particular instance of a cell may be duplicated in the same orientation or it may be duplicated in a different orientation, e.g., rotated 90°, 180°, or 270°. An identification parameter for a cell may specify an orientation of the cell. A particular instance of a cell may be located adjacent to one or more other particular cells. The other cells may be instances of one parent, or instances of different parents. An identification parameter for a cell may specify one or more adjacent neighbor cells.

The operation 308 may compare an identification parameter associated with a particular cell (or cells) associated with a violation with an identification parameter associated with cells (or cells) associated with each defined category of violation. In one embodiment, an identification parameter of a particular cell is not sufficiently similar to an identification parameter of a cell associated with one of the defined violation categories if both the particular cell and the associated cell are not instances of the same parent cell. In another embodiment, an identification parameter of a particular cell is not sufficiently similar to an identification parameter of a cell associated with one of the defined categories if both the particular cell and the associated cell are within larger cells and the respective larger cells are not instances of the same parent cell. A violation may be associated with more than one cell if, for example, an error marker is located in one cell and a violating shape is located in another cell. In yet another embodiment, an identification parameter associated with two or more cells associated with a violation is not sufficiently similar to an identification parameter associated with two or more cells associated with a defined category of violation if both the particular cell and the associated cell are each adjacent to a second cell, and the respective second cells are not instances of the same parent cell. If the identification parameter of the particular cell (or cells) is not sufficiently similar to the identification parameter of a cell (or cells) associated with one of the defined categories, a new category may be created in operation 206. If the identification parameter of the particular cell is sufficiently similar to an identification parameter of one of the defined violation categories, then the deciding operation 204 may move to an operation 310.

In operation 310, a local region or a "window" around each violation may be determined and geometric shapes or features located within the local region may be compared with geometric shapes or features located within a local region associated with each defined category of violation. In various embodiments, the geometric shapes or features may be one-, two-, or three dimensional. A local region may be a rectangular or elliptical section of a layout and an error marker may be located at the center of the region. The size of the local region may be defined as a function of the size of the error marker, the distance from the error marker to a violating shape, or a combination of these or other parameters. In one embodiment, the local region may be 50-75 nm. In one embodiment, the dimensions of a local region around a violation and the dimensions of a local region around a defined category violation may be the same. Accordingly, the respective local regions may include the same numbers of pixels and may be at the same scale.

In one embodiment, the geometric shapes in a local region associated with a violation and the geometric shapes in a local region associated with a defined violation category may be compared by computing and comparing histograms for the respective regions. Typically, the pixels of a local region may be of a relatively small number of predetermined colors. Histograms may be computed and compared rapidly, and because the respective local regions may be of the same scale, local regions with matching geometric shapes or features will have matching histograms. Histogram comparison is generally not influenced by orientation of a cell. Histogram comparison may be used to rapidly exclude one or more defined categories of violation.

In one embodiment, the geometric shapes in a local region associated with a violation and the geometric shapes in a local region associated with a defined violation category may be compared by determining and comparing edges in the respective regions. Typically, the pixels of a local region may be of a relatively small number of predetermined colors on a high contrast color background. For example, a metal polygon may be green with a black background. As another example, a via polygon may be yellow with a black background. Accordingly, edge features may be sharply defined. Vertical edge features between the regions of contrasting color may be determined by comparing neighboring pixel values while traversing the image horizontally, and horizontal edge features may be determined by comparing neighboring pixel values while traversing the image vertically. Alternatively, more sophisticated edge detection processes may be used, e.g., a Canny edge detector. Generally, an edge detection process will produce an image of edges having the same dimensions as the respective local regions. An image of edges may be produced for a local region associated with a violation. Similarly, an image of edges may be produced for a local region associated with a defined violation category. One of the edge images may be subtracted from the other edge image to determine if the respective images have similarly located edges. Because orientation is important in determining whether edges match, one of the respective images may be rotated in 90° increments through 360° and the image subtraction repeated. If the geometric shapes are not sufficiently similar, a new category may be created in operation 206. If one or more parameters related to geometric shapes or features of a particular cell are not sufficiently similar to one or more parameters related to geometric shapes or features of a cell associated with one of the defined violation categories, a new category may be created in operation 206. If the geometric parameter(s) of the particular cell are sufficiently similar to the geometric parameter(s) of one of the defined violation categories, then the violation may be placed within that category at operation 210.

For the deciding operation 204, each step may be a discrete component of the categorization process and, in various embodiments, the deciding operation 204 may be modified to omit one or more of the operations 302-310. Also, operations 302-310 may be performed in any suitable or desired sequence.

Figure 4:
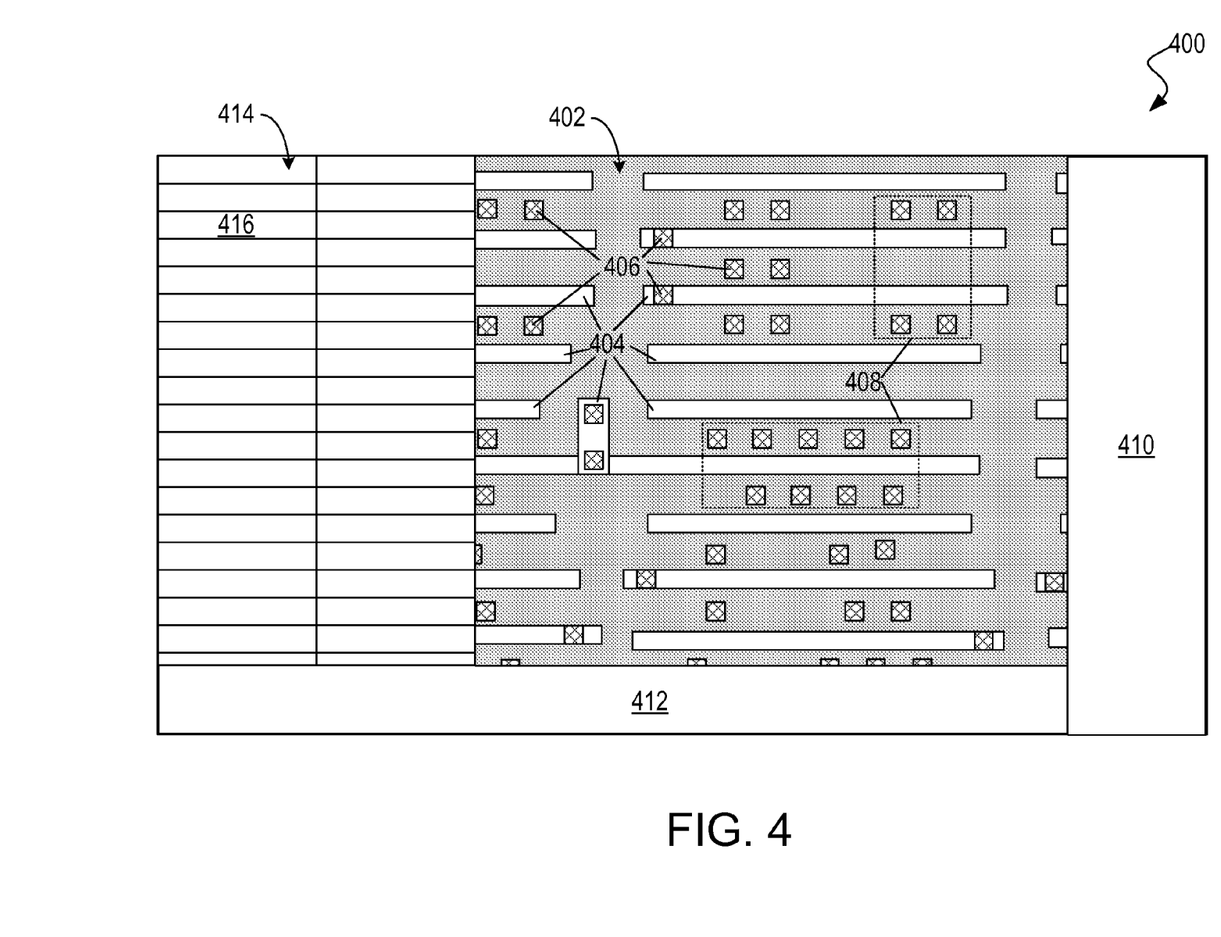
FIG. 4 illustrates an image displayed by a DRC program, in accordance with embodiments of the present invention.

FIG. 4 illustrates an image displayed by a DRC program, in accordance with embodiments of the present invention. The display 400 may contain a view 402 of a particular layer of a layout design. The view 402 may contain the elements that are present within a particular layer of a layout design. These elements may represent physical elements or features of the IC design or they may be notational elements. Examples of physical elements or features may be polycrystalline silicon (PC) elements 404, vias 406, or any other physical IC elements. Examples of notational elements may be cells 408, various markers (such as error markers), or any other non-physical element. The display 400 may also contain an area of user tools in a menu 410. Examples of tools include common tools for a software program for running design rules checking, such as navigation or editing tools. Also included in display 400, may be an area 412 which displays information such as the current layer being displayed in view 402, or a selected cell 408. The display 400 may also include an area 414 which may display a list of the rules that the layout violates, along with a number indicating the quantity of errors that violate that rule. For example, if the layout violated a rule such as "102j" a total of a thousand times, the cell 416 may contain "GR102j (1000)" or any similar notation. A user may select a particular rule from area 414 to categorize. When the user selects a particular rule, a design rule violation categorization utility categorizes the violations of that particular rule.

Figure 5A:
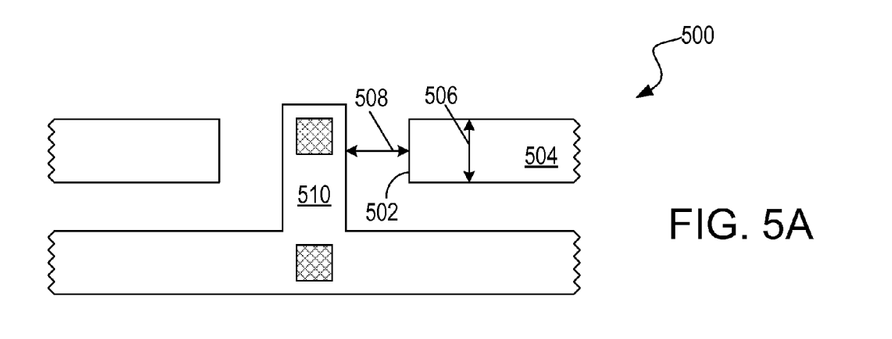
FIGS. 5A, 5B, and 5C illustrate exemplary categories of violations for a particular design rule.
Figure 5B:
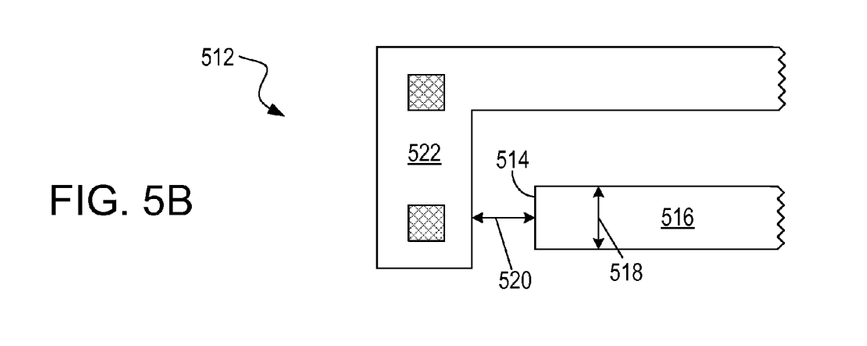
Figure 5C:
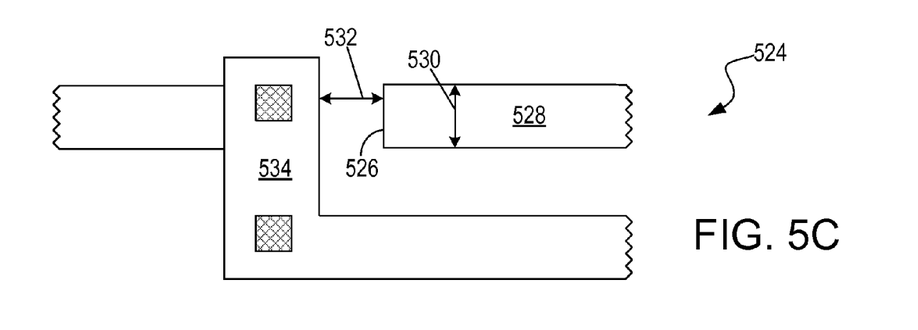

FIGS. 5A, 5B, and 5C illustrate three examples of violations of a particular design rule. These examples represent three different categories of violations of the design rule because the parameters associated with the physical elements or features in the respective local regions are different. For example, the violations may each be a type of violation that violates a design rule such as "102j," which specifies a minimum space or distance between particular elements. FIG. 5A shows a local region 500 which may have an error marker 502 as being the edge of a PC element 504. A measurement of the width 506 of the error marker may also be present. In addition, a measurement 508 from the error marker to a violating shape 510 may be present. FIG. 5B illustrates another local region 512 which may have an error marker 514 as being the edge of a PC element 516. A measurement of the width 518 of the error marker may also be present. Also present may be a measurement 520 from the error marker to a violating shape 522. As may be seen from the figures, violating shape 510 has geometric features that differ from violating shape 522. FIG. 5C illustrates another local region 524 which may have an error marker 526 as being the edge of a PC element 528. Also present, may be a measurement of the width 530 of the error marker. A measurement 532 from the error marker to a violating shape 534 may also be present. As may be seen from the figures, violating shape 534 has geometric features that differ from both violating shapes 510 and 522. While each of the error markers 502, 514, and 526 may be created by a violation of the same design rule 102j, i.e. distance to violating shape, it may be seen from FIGS. 5A-5C that the violations are within local regions having distinct physical elements. Therefore, these three violations of the same design rule may be placed within three different categories in operation 110.

The DRC software may produce a visual representation of a local region of a violation, such as those shown in FIGS. 5A, 5B, and 5C, from each category, and display 116 the visual representations along with the number of occurrences of each error type.

FIG. 6 illustrates an image displayed by a DRC program, the image including a visual representation of one or more categories of error violations, according to an embodiment. In addition to the components of display 400 of FIG. 4, a display 600 may include a window 602 for the display of images 604, 606, 608, and 610. The image 604 may correspond to a local region of an error such as the error shown in FIG. 5A. The images 606, 608 may correspond to local regions of errors such as the errors shown in FIGS. 5B and 5C. The image 610 image may correspond to local region of fourth category of violation error. These images 604, 606, 608, and 610 may be accompanied by a number representing the total occurrences of that error type within the layout design.

Figure 7:
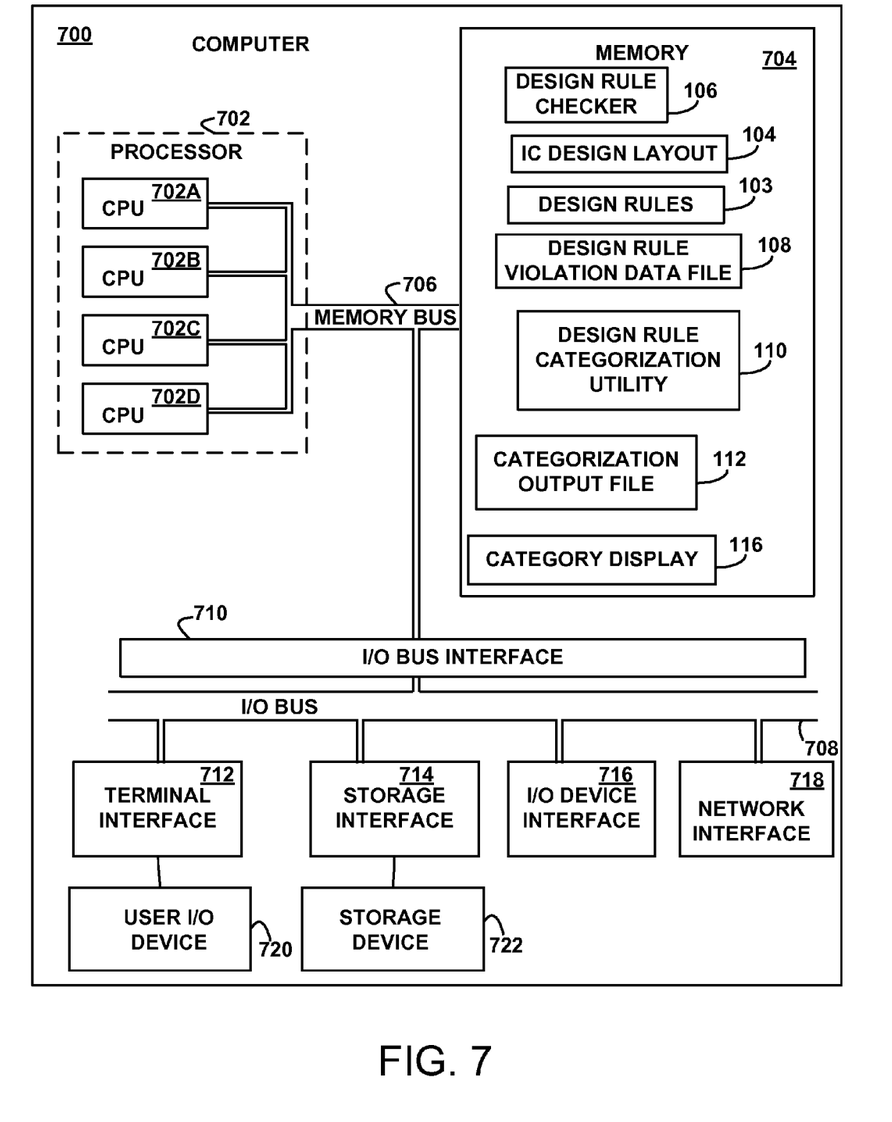
FIG. 7 depicts a high-level block diagram of an exemplary system according to an embodiment of the invention.

FIG. 7 depicts a high-level block diagram of an exemplary system for implementing an embodiment of the invention. The mechanisms and apparatus of embodiments of the present invention apply equally to any appropriate computing system. The major components of the computer system 700 comprise one or more processors 702, a main memory 704, a terminal interface 712, a storage interface 714, an I/O (Input/Output) device interface 716, and a network interface 718, all of which are communicatively coupled, directly or indirectly, for inter-component communication via a memory bus 706, an I/O bus 708, and an I/O bus interface unit 710.

The computer system 700 contains one or more general-purpose programmable central processing units (CPUs) 702A, 702B, 702C, and 702D, herein generically referred to as the processor 702. In an embodiment, the computer system 700 contains multiple processors typical of a relatively large system; however, in another embodiment the computer system 700 may alternatively be a single CPU system. Each processor 702 executes instructions stored in the main memory 704 and may comprise one or more levels of on-board cache.

In an embodiment, the main memory 704 may comprise a random-access semiconductor memory, storage device, or storage medium (either volatile or non-volatile) for storing or encoding data and programs. In another embodiment, the main memory 704 represents the entire virtual memory of the computer system 700, and may also include the virtual memory of other computer systems coupled to the computer system 700 or connected via a network. The main memory 704 is conceptually a single monolithic entity, but in other embodiments the main memory 704 is a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures.

The main memory 704 may store all or a portion of the following: a design rule checker 106, IC design layout 104, design rules 103, design rule violation data file 108, design rule violation categorization utility 110, categorization output file 112, and a category display 116. Although the design rule checker 106, IC design layout 104, design rules 103, design rule violation data file 108, design rule violation categorization utility 110, categorization output file 112, and category display 116 are illustrated as being contained within the memory 704 in the computer system 700, in other embodiments some or all of them may be on different computer systems and may be accessed remotely, e.g., via a network. The computer system 700 may use virtual addressing mechanisms that allow the programs of the computer system 700 to behave as if they only have access to a large, single storage entity instead of access to multiple, smaller storage entities. Thus, while the design rule checker 106, IC design layout 104, design rules 103, design rule violation data file 108, design rule violation categorization utility 110, categorization output file 112, and category display 116 are illustrated as being contained within the main memory 704, these components are not necessarily all completely contained in the same storage device at the same time. Further, although the design rule checker 106, IC design layout 104, design rules 103, design rule violation data file 108, design rule violation categorization utility 110, categorization output file 112, and category display 116 are illustrated as being separate entities, in other embodiments some of them, portions of some of them, or all of them may be packaged together.

In an embodiment, the design rule checker 106, design rule violation categorization utility 110, and category display 116 comprise instructions or statements that execute on the processor 702 or instructions or statements that are interpreted by instructions or statements that execute on the processor 702, to carry out the functions as further described with reference to FIGS. 1, 2, 3, 4, 5, and 6. In another embodiment, the design rule checker 106, design rule violation categorization utility 110, and category display 116 are implemented in hardware via semiconductor devices, chips, logical gates, circuits, circuit cards, and/or other physical hardware devices in lieu of, or in addition to, a processor-based system. In an embodiment, the design rule checker 106, design rule violation categorization utility 110, and category display 116 comprise data in addition to instructions or statements.

The design rule checker 106 checks the IC design layout 104, using the design rules 103. The design rule violation data file 108 contains the violations of the design rules within the IC design layout 104. The design rule violation categorization utility 110 categorizes the design rule violation data 108 and generates a categorization output file 112, which may be used to generate a category display 116.

The memory bus 706 provides a data communication path for transferring data among the processor 702, the main memory 704, and the I/O bus interface 710. The I/O bus interface 710 is further coupled to the I/O bus 708 for transferring data to and from the various I/O units. The I/O bus interface unit 710 communicates with multiple I/O interface units 712, 714, 716, and 718, which are also known as I/O processors (IOPs) or I/O adapters (IOAs), through the I/O bus 708.

The I/O interface units support communication with a variety of storage and I/O devices. For example, the terminal interface unit 712 supports the attachment of one or more user I/O devices 720, which may comprise user output devices (such as a video display device, speaker, and/or television set) and user input devices (such as a keyboard, mouse, keypad, touchpad, trackball, buttons, light pen, or other pointing device). A user may manipulate the user input devices using a user interface, in order to provide input data and commands to the user I/O device 720 and the computer system 700, and may receive output data via the user output devices. For example, a user interface may be presented via the user I/O device 720, such as displayed on a display device, played via a speaker, or printed via a printer.

The storage interface 714 supports the attachment of one or more disk drives or direct access storage devices 722 (which are typically rotating magnetic disk drive storage devices, although they could alternatively be other storage devices, including arrays of disk drives configured to appear as a single large storage device to a host computer). In another embodiment, the storage device 722 may be implemented via any type of secondary storage device. The contents of the main memory 704, or any portion thereof, may be stored to and retrieved from the storage device 722, as needed. The I/O device interface 716 provides an interface to any of various other input/output devices or devices of other types, such as printers or fax machines. The network interface 718 provides one or more communications paths from the computer system 700 to other digital devices and computer systems; such paths may comprise, e.g., one or more networks.

Although the memory bus 706 is shown in FIG. 7 as a relatively simple, single bus structure providing a direct communication path among the processors 702, the main memory 704, and the I/O bus interface 710, in fact the memory bus 706 may comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 710 and the I/O bus 708 are shown as single respective units, the computer system 700 may, in fact, contain multiple I/O bus interface units 710 and/or multiple I/O buses 708. While multiple I/O interface units are shown, which separate the I/O bus 708 from various communications paths running to the various I/O devices, in other embodiments some or all of the I/O devices are connected directly to one or more system I/O buses.

In various embodiments, the computer system 700 is a multi-user mainframe computer system, a single-user system, or a server computer or similar device that has little or no direct user interface, but receives requests from other computer systems (clients). In other embodiments, the computer system 700 is implemented as a desktop computer, portable computer, laptop or notebook computer, tablet computer, pocket computer, telephone, smart phone, or any other appropriate type of electronic device.

FIG. 7 is intended to depict the representative major components of the computer system 700. But, individual components may have greater complexity than represented in FIG. 7, components other than or in addition to those shown in FIG. 7 may be present, and the number, type, and configuration of such components may vary. Several particular examples of such additional complexity or additional variations are disclosed herein; these are by way of example only and are not necessarily the only such variations. The various program components illustrated in FIG. 7 and implementing various embodiments of the invention may be implemented in a number of manners, including using various computer applications, routines, components, programs, objects, modules, data structures, etc., and are referred to herein as "software," "computer programs," or simply "programs."

The computer programs comprise one or more instructions or statements that are resident at various times in various memory and storage devices in the computer system 700 and that, when read and executed by one or more processors in the computer system 700 or when interpreted by instructions that are executed by one or more processors, cause the computer system 700 to perform the actions necessary to execute steps or operations comprising the various aspects of embodiments of the invention. Aspects of embodiments of the invention may be embodied as a system, method, or computer program product. Accordingly, aspects of embodiments of the invention may take the form of an entirely hardware embodiment, an entirely program embodiment (including firmware, resident programs, micro-code, etc., which are stored in a storage device) or an embodiment combining program and hardware aspects that may all generally be referred to herein as a "circuit," "module," or "system." Further, embodiments of the invention may take the form of a computer program product embodied in one or more computer-readable medium(s) having computer-readable program code embodied thereon.

Any combination of one or more computer-readable medium(s) may be utilized. The computer-readable medium may be a computer-readable signal medium or a computer-readable storage medium. A computer-readable storage medium, may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage media may comprise: an electrical connection having one or more wires, a portable computer diskette, a hard disk, a random access memory (RAM), a read-only memory (ROM), an erasable programmable read-only memory (EPROM) or Flash memory, an optical fiber, a portable compact disc read-only memory (CD-ROM), an optical storage device, a magnetic storage device, or any suitable combination of the foregoing. In the context of this document, a computer-readable storage medium may be any tangible medium that can contain, or store, a program for use by or in connection with an instruction execution system, apparatus, or device.

A computer-readable signal medium may comprise a propagated data signal with computer-readable program code embodied thereon, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that communicates, propagates, or transports a program for use by, or in connection with, an instruction execution system, apparatus, or device. Program code embodied on a computer-readable medium may be transmitted using any appropriate medium, including but not limited to, wireless, wire line, optical fiber cable, Radio Frequency, or any suitable combination of the foregoing.

Computer program code for carrying out operations for aspects of embodiments of the present invention may be written in any combination of one or more programming languages, including object oriented programming languages and conventional procedural programming languages. The program code may execute entirely on the user's computer, partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of embodiments of the invention are described with reference to flowchart illustrations and/or block diagrams of methods, apparatus (systems), and computer program products. Each block of the flowchart illustrations and/or block diagrams, and combinations of blocks in the flowchart illustrations and/or block diagrams may be implemented by computer program instructions embodied in a computer-readable medium. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified by the flowchart and/or block diagram block or blocks. These computer program instructions may also be stored in a computer-readable medium that can direct a computer, other programmable data processing apparatus, or other devices to function in a particular manner, such that the instructions stored in the computer-readable medium produce an article of manufacture, including instructions that implement the function/act specified by the flowchart and/or block diagram block or blocks.

The computer programs defining the functions of various embodiments of the invention may be delivered to a computer system via a variety of tangible computer-readable storage media that may be operatively or communicatively connected (directly or indirectly) to the processor or processors. The computer program instructions may also be loaded onto a computer, other programmable data processing apparatus, or other devices to cause a series of operational steps to be performed on the computer, other programmable apparatus, or other devices to produce a computer-implemented process, such that the instructions, which execute on the computer or other programmable apparatus, provide processes for implementing the functions/acts specified in the flowcharts and/or block diagram block or blocks.

The flowchart and the block diagrams in the figures illustrate the architecture, functionality, and operation of possible implementations of systems, methods, and computer program products, according to various embodiments of the present invention. In this regard, each block in the flowcharts or block diagrams may represent a module, segment, or portion of code, which comprises one or more executable instructions for implementing the specified logical function(s). In some embodiments, the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flow chart illustrations, can be implemented by special purpose hardware-based systems that perform the specified functions or acts, in combinations of special purpose hardware and computer instructions.

Embodiments of the invention may also be delivered as part of a service engagement with a client corporation, non-profit organization, government entity, or internal organizational structure. Aspects of these embodiments may comprise configuring a computer system to perform, and deploying computing services (e.g., computer-readable code, hardware, and web services) that implement, some or all of the methods described herein. Aspects of these embodiments may also comprise analyzing the client company, creating recommendations responsive to the analysis, generating computer-readable code to implement portions of the recommendations, integrating the computer-readable code into existing processes, computer systems, and computing infrastructure, metering use of the methods and systems described herein, allocating expenses to users, and billing users for their use of these methods and systems. In addition, various programs described herein may be identified based upon the application for which they are implemented in a specific embodiment of the invention. But, any particular program nomenclature used herein is used merely for convenience, and thus embodiments of the invention are not limited to use solely in any specific application identified and/or implied by such nomenclature. The exemplary environments illustrated in FIG. 7 are not intended to limit the present invention. Indeed, other alternative hardware and/or program environments may be used without departing from the scope of embodiments of the invention.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A computer implemented method comprising:
receiving, from a design rule checker, more than one violation of a design rule within a design layout;
determining dynamically, by using a computer, distinct categories of the design rule violations by comparing one or more parameters associated with the design rule violations, wherein the parameters include a first identification parameter associated with a cell associated with the design rule violation, a second identification parameter including at least that the cell associated with the design rule violation is an instance of a particular parent cell, and
a third identification parameter including at least a specification of one or more adjacent neighbor cells, wherein the specified adjacent neighbor cell includes a violating shape; and comparing elements within a window surrounding each design rule violation.

2. The method of claim 1, further comprising receiving an error marker from the design rule checker, wherein the error marker defines one or more dimensional parameters of each design rule violation and the error marker is in a cell associated with the design rule violation.

3. The method of claim 2, wherein the dimensional parameters include the dimensional parameter specifying a distance from the error marker to the violating shape.

4. The method of claim 1, further comprising displaying, for at least one category, a visual representation of particular parameters associated with an instance of the design rule violation.

5. The method of claim 1, wherein the parameters include a parameter specifying a layer of the design layout in which the design rule violation occurs.

6. A computer implemented method for categorizing violations of a design rule, comprising:
receiving, from a design rule checker, two or more of violations of a design rule within an integrated circuit (IC) layout, each violation having an error marker and the IC layout having two or more cells;
determining dynamically, by using a computer, a local region for each of the violations wherein the local region is in a first cell, the violation is associated with a particular cell adjacent to the first cell, and parameters associated with the local region include an identification parameter of the adjacent cell, wherein the adjacent cell includes a violating shape; and for each of the violations:
- determining one or more parameters associated with the local region, wherein the parameters include the identification parameter associated with a cell associated with the design rule violation, the identification parameter including at least that the cell associated with the design rule violation is an instance of a particular parent cell, wherein the parameters associated with the local region includes a dimension of the error marker and includes a distance from the error marker to the violating shape, and
- classifying the violation as being in a particular error category when the associated parameters are substantially similar to corresponding parameters for the error category.

7. The method of claim 6, further comprising determining a histogram for the local region and comparing the histogram for the local region with respective histograms for local regions associated with one or more categories of error violation.

8. The method of claim 6, wherein the parameters associated with the local region includes a geometric parameter.

9. The method of claim 6, wherein the parameters associated with the local region include a layer parameter.

10. The method of claim 6, wherein the local region is in a first cell and the parameters associated with the local region include an identification parameter of the first cell.

11. A non-transitory computer readable storage medium having instructions stored thereon which, when executed, cause a processor to perform the following operations:
- receiving, from a design rule checker, two or more of violations of a design rule within an integrated circuit (IC) layout, each violation having an error marker and the IC layout having two or more cells;
- determining dynamically a local region for each of the violations wherein the local region is in a first cell, the violation is associated with a particular cell adjacent to the first cell, and the parameters associated with the local region include an identification parameter of the adjacent cell, wherein the adjacent cell includes the violation; and
- for each of the violations:
  - determining one or more parameters associated with the local region, wherein the parameters include the identification parameter associated with a cell associated with the design rule violation, the identification parameter including at least that the cell associated with the design rule violation is an instance of a particular parent cell, and
  - dynamically classifying the violation as being in a particular error category when the associated parameters are substantially similar to corresponding parameters for the error category.

12. The storage medium of claim 11, wherein the parameters associated with the local region includes a dimension of the error marker.

13. The storage medium of claim 11, wherein the parameters associated with the local region includes a distance from the error marker to a violating shape.

14. The storage medium of claim 11, wherein the parameters associated with the local region includes a geometric parameter.

15. The storage medium of claim 11, wherein the parameters associated with the local region include a layer parameter.

16. The storage medium of claim 11, wherein the local region is in a first cell and the parameters associated with the local region include an identification parameter of the first cell.

* * * * *